(12) United States Patent
Kim et al.

(10) Patent No.: US 8,747,611 B2
(45) Date of Patent: Jun. 10, 2014

(54) APPARATUS AND METHOD FOR TREATING SUBSTRATE, AND INJECTION HEAD USED IN THE APPARATUS

(75) Inventors: Hyun-Jong Kim, Chungcheongnam-do (KR); Young-Ki Ahn, Chungcheongnam-do (KR)

(73) Assignee: Semes Co. Ltd, Chungcheongnam-do (KR)

( * ) Notice: Subject to any disclaimer, the term of this patent is extended or adjusted under 35 U.S.C. 154(b) by 1740 days.

(21) Appl. No.: 11/805,758

(22) Filed: May 24, 2007

(65) Prior Publication Data

US 2007/0275562 A1 Nov. 29, 2007

(30) Foreign Application Priority Data

May 25, 2006 (KR) ........................ 10-2006-0047217

(51) Int. Cl.
*B05C 11/02* (2006.01)
*H01L 21/30* (2006.01)

(52) U.S. Cl.
USPC .... 156/345.55; 118/52; 118/300; 156/345.21

(58) Field of Classification Search
USPC .................. 156/345.55, 345.17; 118/52, 300, 118/345.21
See application file for complete search history.

(56) References Cited

U.S. PATENT DOCUMENTS

| | | | |
|---|---|---|---|
| 3,953,276 A * | 4/1976 | Glorioso et al. | 156/345.17 |
| 5,842,492 A * | 12/1998 | Lee | 134/176 |
| 6,325,083 B1 * | 12/2001 | Worter | 134/180 |
| 6,357,457 B1 * | 3/2002 | Taniyama et al. | 134/57 R |
| 7,264,008 B2 * | 9/2007 | Kim et al. | 134/151 |
| 7,503,978 B2 * | 3/2009 | Miya et al. | 118/500 |

FOREIGN PATENT DOCUMENTS

| | | |
|---|---|---|
| JP | 10-064831 A | 3/1998 |
| JP | 11319732 A | 11/1999 |
| KR | 1020010055816 A | 7/2001 |
| KR | 1020030008658 A | 1/2003 |
| KR | 1020050026766 A | 3/2005 |

* cited by examiner

*Primary Examiner* — Sylvia R MacArthur
(74) *Attorney, Agent, or Firm* — Jenkins, Wilson, Taylor & Hunt, P.A.

(57) ABSTRACT

Provided are an injection head, and a substrate treatment apparatus and method using the same. The substrate treatment apparatus includes a rotatable spin head supporting a substrate, an injection head installed on the spin head to supply a fluid to a bottom surface of the substrate supported on the spin head, and a fluid supply unit supplying the fluid to the injection head. The injection head includes a body disposed below a center region of the substrate supported on the spin head to receive the fluid from the fluid supply unit and a injection member extending from the body to an edge region of the substrate supported on the spin head to inject the fluid supplied from the body to the bottom surface of the substrate, the injection member having first injection openings injecting the fluid to the edge region of the substrate and second injection openings injecting the fluid to a middle region disposed between the center region and the edge region, and a flow path through which the fluid is supplied to the first injection openings and then to the second injection openings.

13 Claims, 9 Drawing Sheets

APPARATUS AND METHOD FOR TREATING SUBSTRATE, AND INJECTION HEAD USED IN THE APPARATUS

CROSS-REFERENCE TO RELATED APPLICATIONS

This U.S. non-provisional patent application claims priority under 35 U.S.C. §119 of Korean Patent Application No. 2006-47217, filed on May 25, 2006, the entire contents of which are hereby incorporated by reference.

BACKGROUND

The present invention disclosed herein relates to a substrate treatment apparatus and a substrate treatment method, and more particularly, to a substrate treatment apparatus and method capable of uniformly treating a bottom surface of a substrate.

Generally, a plurality of thin layers such as a polycrystal layer, oxide layer, a nitride layer and a metal layer are deposited on a wafer used as a substrate in fabrication processes of semiconductor devices. A photoresist layer is coated on the thin layers. A pattern formed on a photomask using an exposure process is transferred onto the photoresist layer. Thereafter, a desired pattern is formed on the wafer by an etching process.

Unnecessary impurities such as various thin layers and photoresists remain on a bottom surface of the wafer performed by the above-described processes. The thin layers and photoresists acting as particles pollute equipment during subsequent processes. Thus, an etching process is required to remove unnecessary impurity layers such as various thin layers and photoresists remaining on the bottom surface of the wafer.

A substrate treatment apparatus for etching the bottom surface of the substrate includes an injection head injecting a chemical solution to the bottom surface of the rotating wafer. The injection head includes a body disposed in a center region of a lower portion of the wafer and an injection member extended from the body to an edge region of the wafer. A plurality of injection openings are formed on the injection member. The chemical solution is injected through the openings to the bottom surface of the wafer. The chemical solution injected to the bottom surface of the wafer flows toward the edge region of the wafer due to rotation of the wafer to remove the impurities remaining on the bottom surface of the wafer.

However, a conventional substrate treatment apparatus has following problems.

The chemical solution supplied to the injection member flows from an inside of the injection member corresponding to the center region of the wafer to an outside of the injection member corresponding to the edge region of the wafer. The chemical solution is first injected through the injection openings formed on the inside of the injection member and is then injected through the injection openings formed on the outside of the injection member.

As the injection openings are distant from the center region of the wafer, an internal pressure decreases because the chemical solution is injected through the injection openings. Therefore, it is difficult that a flow and injection pressure of the chemical solution injected at the injection openings formed on the outside of the injection member are exactly controlled due to pressure drop. Also, although a non-processed area increases progressively further from the center region of the wafer, an exact control of the flow and the injection pressure is not difficult. Therefore, the impurity layers formed in the edge region of the wafer are not satisfactorily etched, thereby decreasing an etching uniformity of the bottom surface of the wafer.

SUMMARY OF THE INVENTION

The present invention provides an injection head capable of sufficiently etching an edge region of a wafer.

The present invention also provides an injection head capable of uniformly etching a bottom surface of a wafer.

Embodiments of the present invention provide substrate treatment apparatuses by injecting a fluid to a bottom surface of the substrate. The substrate treatment apparatuses include a rotatable spin head supporting a substrate, an injection head installed on the spin head to supply a fluid to a bottom surface of the substrate supported on the spin head, and a fluid supply unit supplying the fluid to the injection head. The injection head includes a body disposed below a center region of the substrate supported on the spin head to receive the fluid from the fluid supply unit and a injection member extending from the body to an edge region of the substrate supported on the spin head to inject the fluid supplied from the body to the bottom surface of the substrate. The injection member having first injection openings injecting the fluid to the edge region of the substrate and second injection openings injecting the fluid to a middle region disposed between the center region and the edge region, and a flow path through which the fluid is supplied to the first injection openings and then to the second injection openings.

In some embodiments, the injection member includes a first flow path and a second flow path therein, the first flow path having the fluid flowing from one end of the injection member connected to the body toward the other end of the injection member and the second flow path extending from the first flow path and having the fluid flowing from the other end of the injection member toward the one end of the injection member, the second injection openings being formed on the second flow path.

In other embodiments, the first injection openings are formed on the first flow path. The first flow path is disposed parallel to the second flow path. Also, the flow paths have a "U" shape. Distances between the first injection openings are narrower than those of the second injection openings. The first injection openings are slopingly formed from the center region of the substrate to a distant direction. The first injection openings are slopingly formed such that each top portion of the first injection openings are directed to the edge region of the substrate.

In still other embodiments, the body includes a gas injection opening injecting a gas to the center region of the substrate to help the fluid injected from the injection member to flow toward the edge region of the substrate. Also, the injection member includes third injection openings injecting the fluid to the center region of the substrate. The third injection openings are slopingly formed toward the center of the substrate.

In other embodiments of the present invention, substrate treatment apparatuses include a body supplied with a fluid and an injection member extended from the body to inject the fluid supplied from the body. The injection member has a first flow path and a second flow path therein, the first flow path having the fluid flowing from one end of the injection member connected to the body toward the one end of the injection member, and the second flow path extended from the first flow path and having the fluid flowing from the other end of the injection member toward the one end of the injection member, and injection openings through which the fluid is injected such that injection openings on the other end region of the injection member inject the fluid before the injection openings on a region between both ends of the injection member.

In some embodiments, the first flow path has first injection opening injecting the fluid at the other end region of the injection member and the second flow path has second injection openings injecting the fluid at the region between the one end and the other end of the injection member.

In other embodiments of the present invention, substrate treatment methods include supplying a fluid from a position corresponding to a center region of the substrate toward the injection member disposed below a substrate and injecting the fluid to an edge region of the substrate before injecting the fluid to a middle region between the center region and the edge region of the substrate with the injection member.

In some embodiments, the fluid is injected to the center region of the substrate before injecting the fluid to the edge region of the substrate. The methods further include injecting a gas to the center region of the substrate to help a chemical solution injected from the injection member to flow toward the edge region of the substrate.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to FIGS. 1 through 7. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, although the present invention is described with a wafer W as an example of a substrate, the present invention is applicable to various substrates besides the wafer W.

Figure 1:
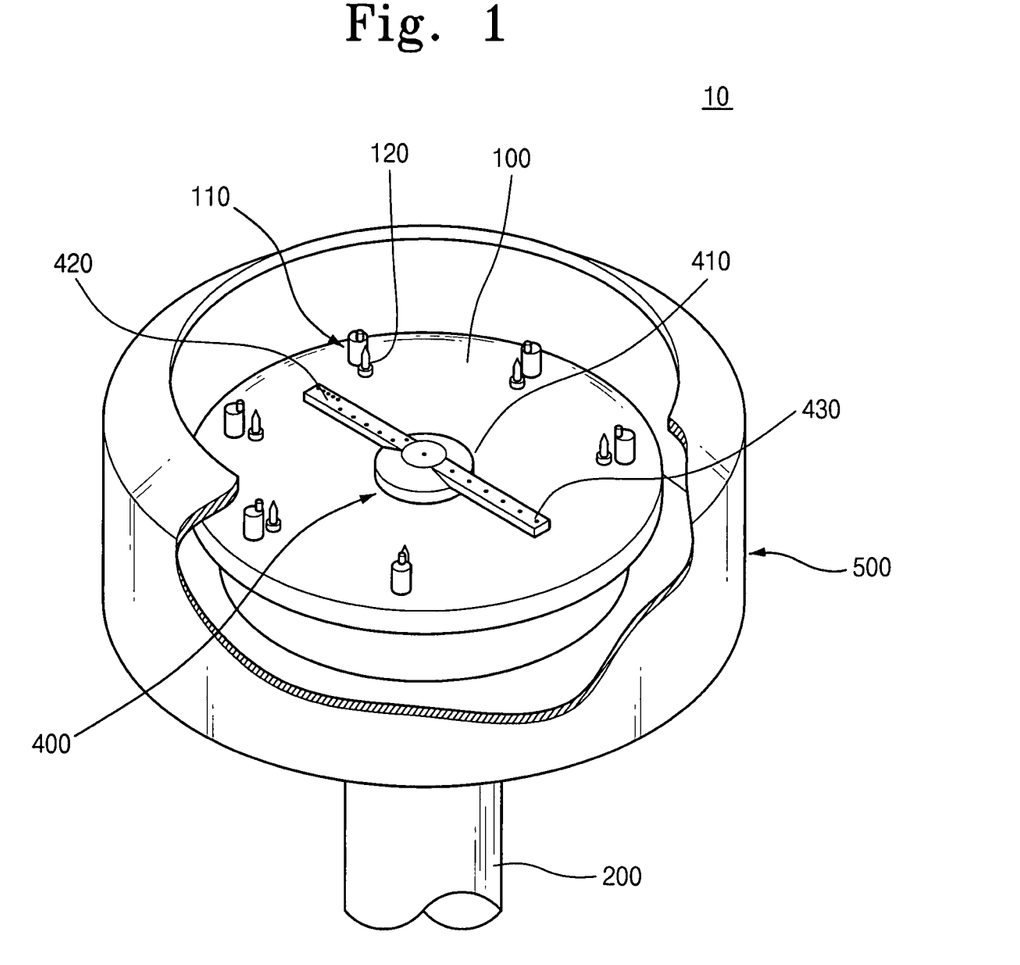
FIG. 1 is a partial cut-away perspective view of a substrate treatment apparatus according to the present invention.
Figure 2:
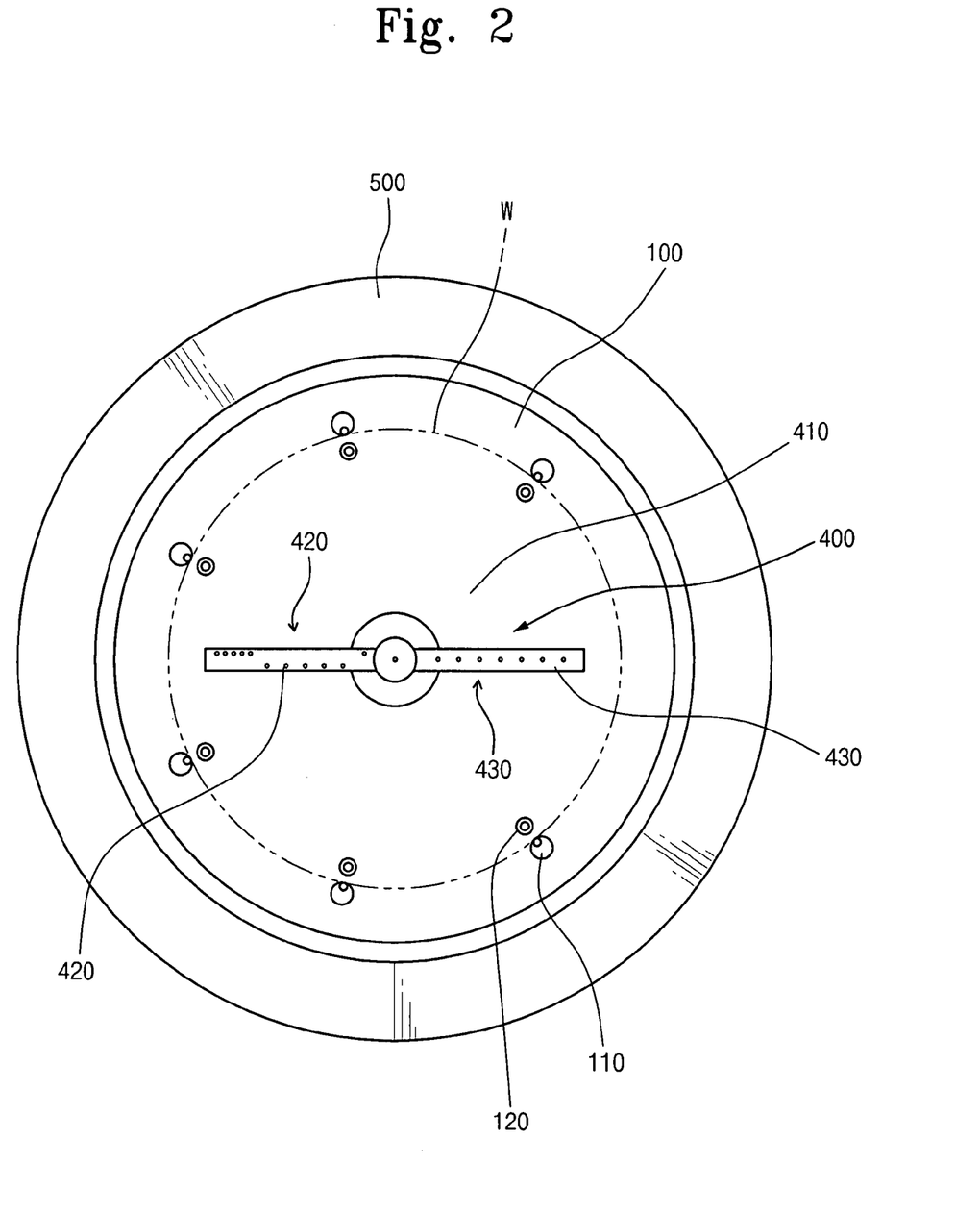
FIG. 2 is a plan view of the substrate treatment apparatus illustrated in FIG. 1.
Figure 3:
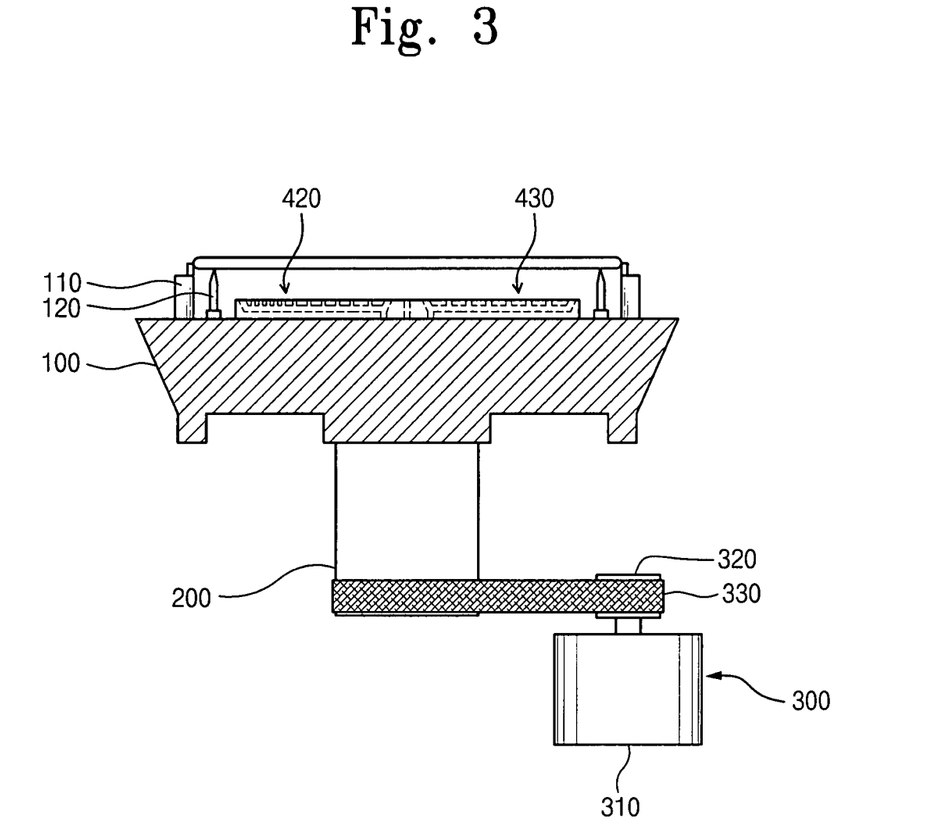
FIG. 3 is a front projection view of the substrate treatment apparatus illustrated in FIG. 1.

FIG. 1 is a partial cut-away perspective view of a substrate treatment apparatus 10 according to the present invention and FIG. 2 is a plan view of the substrate treatment apparatus illustrated in FIG. 1. FIG. 3 is a front projection view of the substrate treatment apparatus illustrated in FIG. 1

The substrate treatment apparatus 10 according to the present invention performs a uniform etching treatment on a bottom surface of a substrate, and includes a spin head 100, a rotating shaft 200, a driving unit 300 and an injection head 400.

The spin head 100 having a disk shape rotates a wafer W in such a state that the wafer W is supported. A plurality of supporting pins 120 for supporting the bottom surface of the wafer W and a plurality of chucking pins 110 for supporting a side of the wafer W are installed on the spin head 100. The wafer W is placed on the supporting pins 120 and then the chucking pins 110 are rotated before the wafer W is rotated. When the chucking pins are rotated, a position of the wafer W is arranged and fixed by the chucking pins 110. Thus, the chucking pins 110 can prevent separation of the wafer W from the spin head 100 when the spin head 100 is rotated.

The rotating shaft 200 connected to the spin head 100 is rotated by a driving unit 300 to be described below. An upper end of the rotating shaft 200 is connected to the spin head 100 and a lower end of the rotating shaft 200 is connected to the driving unit 300. The rotating shaft 200 transmits a torque of the driving unit 300 to the spin head 100.

The rotating shaft 200 having a hollow shaft shape includes a rinse solution supply line 442, a gas supply line 444 and a cleaning solution supply line 446. The lines 442, 444 and 446 will be described below.

The driving unit 300 includes a driving motor 310, a driving pulley 320 and a belt 330. The driving motor 310 generates driving force by a power supply applied from an external power source. The driving pulley 320 connected to the driving motor 310 is connected to the rotating shaft 200 through the belt 330. The torque generated by the driving motor 310 is transmitted to the rotating shaft 200 through the belt 330. A rotating speed of the rotating shaft 200 can be adjusted by adjusting a diameter ratio of the rotating shaft 200.

The substrate treatment apparatus 10 further includes a tank 500. The tank 500 prevents a cleaning solution from scattering from the wafer W to an outside due to rotation of the spin head 100. Because an acid solution is used as the cleaning solution, the tank 500 is installed around the spin head 100 to protect peripheral devices. The tank 500 has an opening where the wafer W comes in and goes out on an upper end and is disposed so that the tank 500 wraps the spin head 100.

Figure 4:
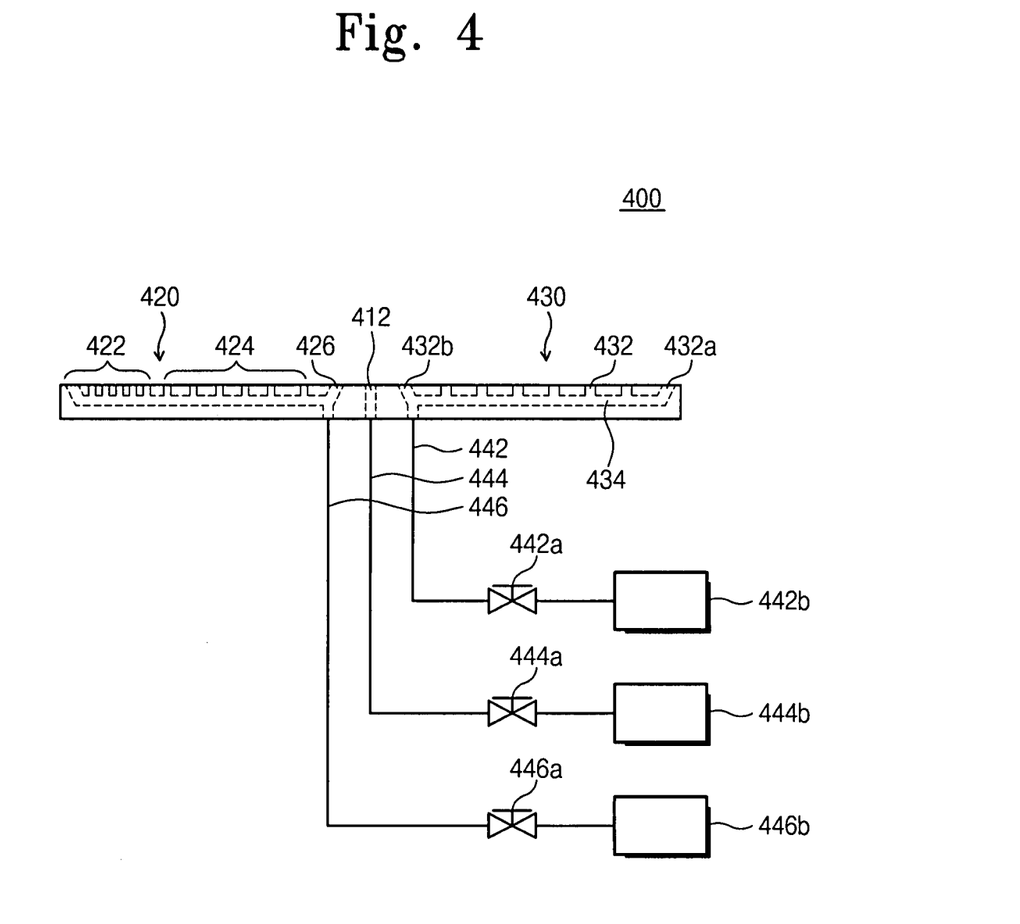
FIG. 4 is a projection view of an injection head according to an embodiment of the present invention.

FIG. 4 is a projection view of an injection head 400 according to an embodiment of the present invention.

The injection head 400 is installed on the spin head 100 and supplies a fluid to the bottom surface of the wafer W. As described above, an etching process is required to remove unnecessary impurity layers such as various thin layers and photoresists, which remain on the bottom surface of the wafer W. The spin head 100 supplies the fluid to the bottom surface of the wafer W etch the unnecessary impurity layers.

The injection head 400 includes a body 410 disposed below a center region of the bottom surface of the wafer W, a first injection member 420 extended in a radial direction from the body 410 and a second injection member 430 extended in an opposite direction of the first injection member 420 from the body 410.

The body having a disk shape is connected to the rinse solution supply line 442, the gas supply line 444 and the cleaning solution supply line 446. Thus, a rinse solution is supplied to the body 410 through the rinse solution supply line 442. A gas is supplied to the body 410 through the gas supply line 444. The cleaning solution is supplied to the body 410 through the cleaning solution supply line 446.

A gas injection opening 412 is formed on a center of the body 410. The gas supplied from the gas supply line 444 is injected to the center region of the bottom surface of the wafer W through the gas injection opening 412 to help the cleaning solution injected to the bottom surface of the wafer W to smoothly flow toward an edge region of the wafer W. Preferably, the gas uses an inactive gas such as a nitrogen gas.

Figure 5:
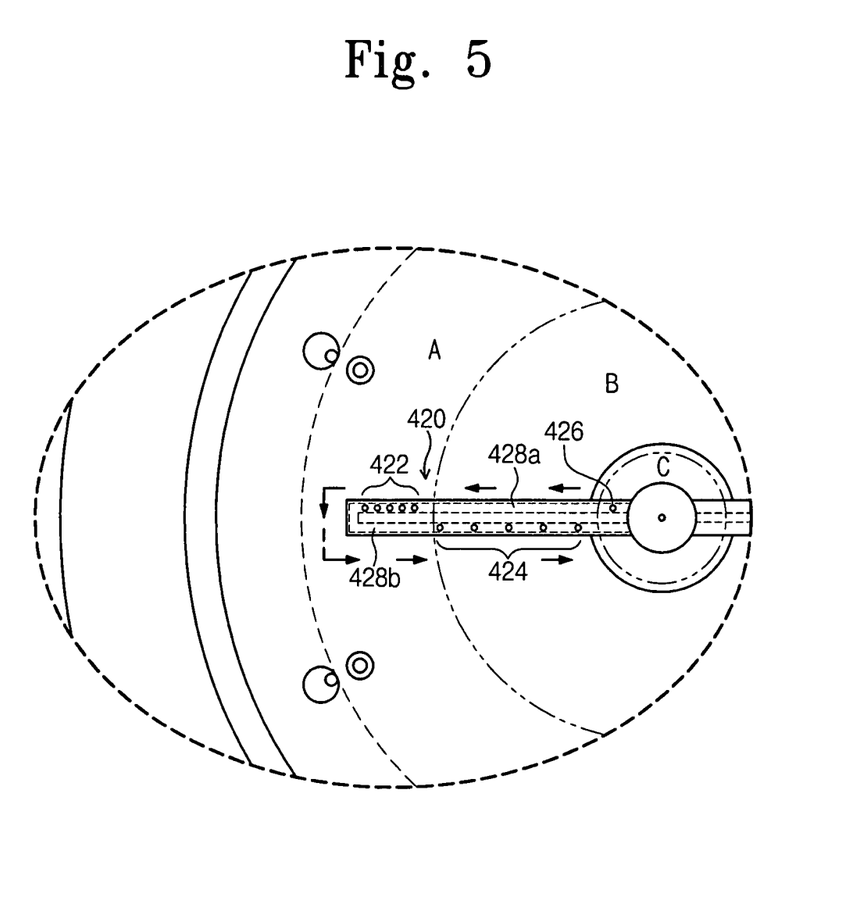
FIG. 5 is a plan projection view of an injection member according to an embodiment of the present invention.

FIG. 5 is a plan projection view of a first injection member 420 according to an embodiment of the present invention.

The first injection member 420 injects the cleaning solution to the bottom surface of the wafer W. The cleaning solution is used for separating the impurity layer remaining on the bottom surface of the wafer W. A hydrofluoric acid solution may be used as the cleaning solution. Although the cleaning solution is used to a treatment solution in this embodiment, the present invention is not limited to the cleaning solution and also may use various chemical solutions and process gases besides the cleaning solution.

A cleaning solution flow path 428 through which the cleaning solution provided from the cleaning solution supply line 446 flows is formed inside the first injection member 420. The cleaning solution flow path 428 has a first flow path 428a where the cleaning solution flows from one end of the first injection member 420 connected to the body 410 to the other end of the first injection member 420 and a second flow path 428b where the cleaning solution flows toward the one end of the first injection member 420 from the other end of the first injection member 420.

Referring to FIG. 5, the first flow path 428a and the second flow path 428b having a "U" shape are disposed in a parallel direction with respect to the wafer W disposed above the injection head 400, respectively. Also, the first flow path 428a is communicated with the second flow path 428b. In another embodiment, the first path 428a and the second flow path 428b may be individually disposed in a vertical direction, that is, in a longitudinal direction with the wafer W.

The cleaning solution supply line 446 is connected to the first flow path 428a and the cleaning solution is supplied to the first flow path 428a through the cleaning solution supply line 446. The cleaning solution supplied to the first flow path 428a flows along the first flow path 428a to the second flow path 428b.

Referring to FIG. 5, first injection openings 422, second injection openings 422 and third injection openings 424 are formed on an upper surface of the first injection member 420. The wafer W can be divided into the edge region (hereinafter referred to as a "region A"), the center region (hereinafter referred to as a "region C") and a middle region (hereinafter referred to as a "region B") defined between the edge region and the center region. Here, the cleaning solution is injected into the region A through the first injection openings 422, into the region B through the second injection openings 424 and into the region C through the third injection openings 426.

Sizes of the region A, the region B and the region C are determined by dispositions of the first injection openings 422, the second injection openings 424 and the third injection openings 426, respectively. The dispositions of the first injection openings 422, the second injection openings 424 and the third injection openings 426 may be determined with regard to uniformity of a cleaning process.

Meanwhile, the first and third injection openings 422 and 426 are formed on the first flow path 428a and the second injection openings 424 are formed on the second flow path 428b. Therefore, when the cleaning solution is supplied to the first flow path 428a through the cleaning solution supply line 446, the supplied cleaning solution flows along the first flow path 428a and is first injected at the third injection openings 426 and is then injected at the first injection openings 422. When the cleaning solution is supplied to the second flow path 428b, the cleaning solution is lastly injected at the second injection openings 424.

However, positions of the first injection openings 422, the second injection openings 424 and the third injection openings 426 may be somewhat changed according to an embodiment of the present invention. In an embodiment of the present invention, the cleaning solution is supplied to the region A and then to the region B. Thus, the third injection openings 426 may be formed on the second flow path 428a and the first injection openings 422 may be also formed on the second flow path 428a. Although the positions of the first injection openings 422 and the third injection openings 426 are changed, objects of the present invention can be achieved. More detailed explanations will be described below.

Referring to FIG. 3, the first injection member 420 cannot be extended by a length corresponding to a radius of the wafer W due to the supporting pins 120. Thus, it is difficult that the cleaning solution is supplied to an end portion of the region A. Also, the gas injection opening 412 is formed at the center of the body 410. The center of the body 410 corresponds to the center of the wafer W. The third injection openings 426 are offset from the center of the body by a predetermined distance 410. Thus, it is difficult that the cleaning solution is supplied to the center region of the wafer W.

Accordingly, as illustrated in FIG. 4, the first injection openings 422 are slopingly formed toward a distant direction from the center of the wafer W to supply the cleaning solution to the region A. Also, the third injection openings 426 are slopingly formed toward a central direction of the wafer W to supply the cleaning solution to the center region of the wafer W.

Meanwhile, a length of circumference is in proportion to a radius. Therefore, when the wafer is rotated through one full revolution, the more the injection openings are distant from the center of the wafer W, the more a non-processed area increases. In the non-processed area of a single injection opening, the non-processed area of the region A is larger than that of the region B. Thus, it is preferable that distances of the first injection openings 422 are denser than those of the second and third injection openings 424 and 426.

The second injection member 430 injects the rinse solution to the bottom surface of the wafer W. The rinse solution is used for removing impurities separated from the bottom surface of the wafer W using the cleaning solution. Deionized water may be used as the rinse solution.

A rinse solution flow path 434 through which the rinse solution supplied through the rinse solution supply line 442 flows is formed within the second injection member 430. The rinse solution flow path 434 is extended in a radial direction of the spin head 100 toward an edge region of the spin head 100 from a center region of the spin head 100.

A plurality of rinse solution injection openings 432 communicated with the rinse solution flow path 434 are formed on an upper surface of the second injection member 430. In an embodiment of the present invention, although the rinse solution injection openings 432 are disposed to be separated from each other by a predetermined distance, the rinse solution injection openings 432 may be more densely disposed at a portion corresponding to the edge region of the wafer W because the edge region of the wafer W has a larger area to be processed than that of the center region of the wafer W using a rinse solution.

The rinse solution injection openings 432 include first injection openings 432a supplying the rinse solution to the edge region of the wafer W and second injection openings 432b supplying the rinse solution to the center region of the wafer W.

The second injection member 430 as well as the first injection member 420 cannot be extended by a length corresponding to a radius of the wafer W due to the supporting pins 120. Thus, it is somewhat difficult that the cleaning solution is supplied to the edge region of the wafer W. Also, the gas injection opening 412 is formed at the center of the body 410. The rinse injection openings 432 are offset from the center of the body by a predetermined distance 410. Thus, it is somewhat difficult that the rinse solution is supplied to the center region of the wafer W.

Referring to FIG. 4, the first injection openings 432a are slopingly formed toward a distant direction from the center of the wafer W to supply the rinse solution to the edge region of the wafer W. Also, the second injection openings 432b are slopingly formed toward a central direction of the wafer W to supply the rinse solution to the center region of the wafer W.

As described above, the gas supply line 444 is connected to the gas injection opening 412 and the rinse solution supply line 442 is connected to the rinse solution flow path 434. Also, the cleaning solution supply line 446 is connected to the cleaning solution flow path 428. A rinse solution valve 442a, a gas valve 444a and a cleaning solution valve 446a are installed at the rinse solution supply line 442, the gas supply line 444 and the cleaning solution supply line 446, respectively. A rinse solution reservoir 442b, a gas reservoir 444b and a cleaning solution reservoir 446b are installed at ends of the lines, respectively.

Figure 6A:
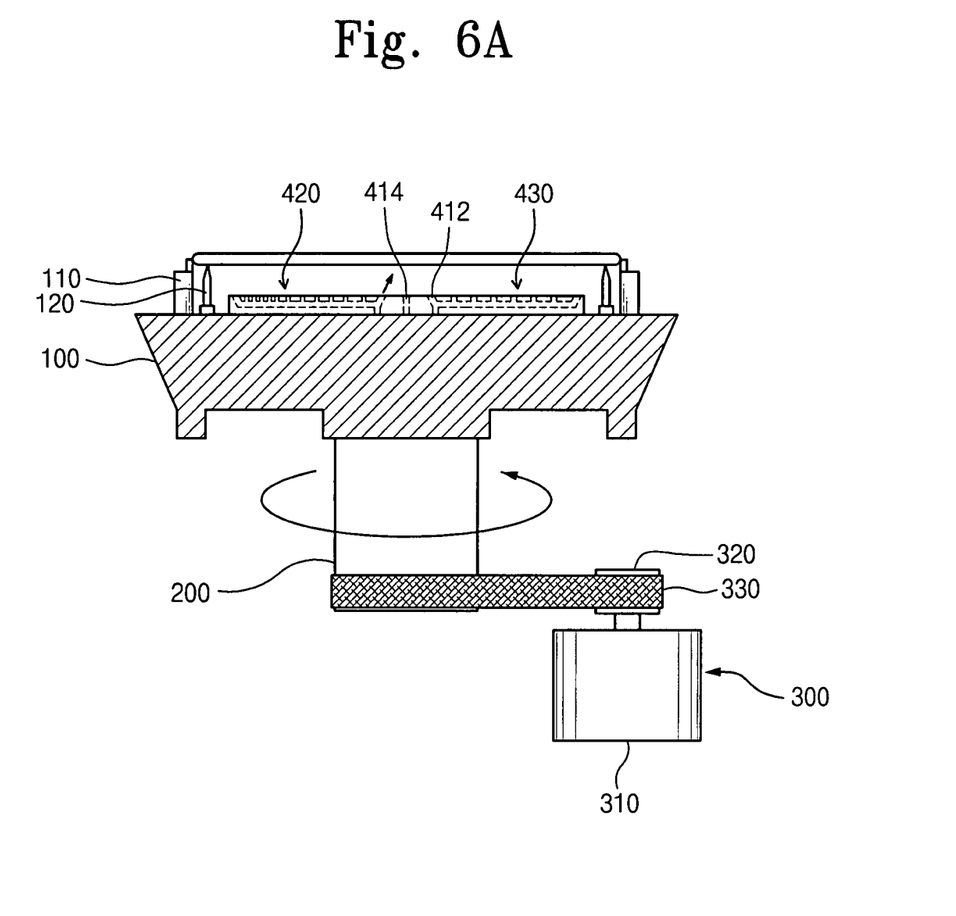
FIGS. 6A through 6C are front projection views illustrating a substrate treatment method using the injection head according to an embodiment of the present invention.
Figure 6B:
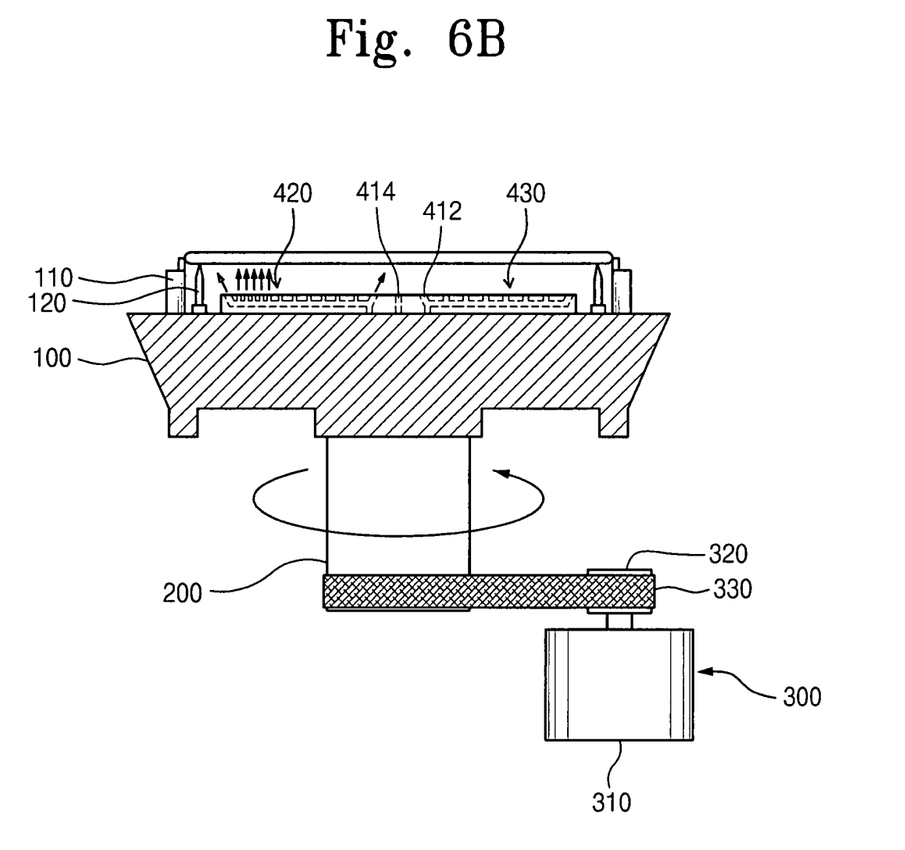
Figure 6C:
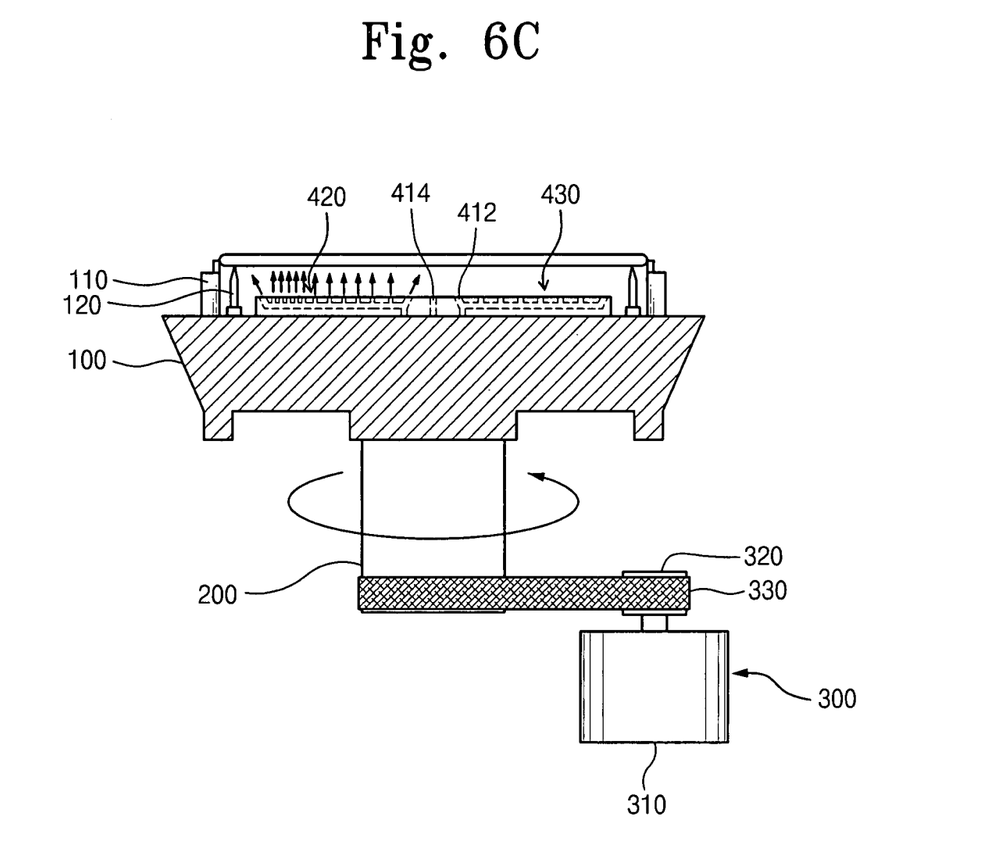
Figure 7:
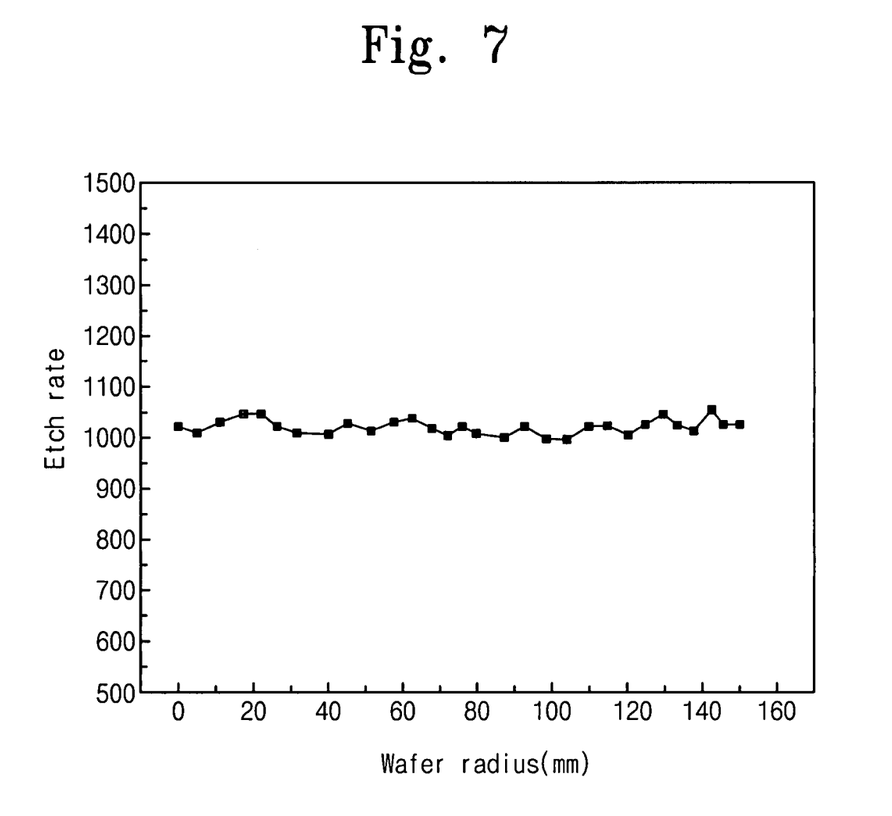
FIG. 7 is a graph illustrating a result of treating a substrate using an injection head according to an embodiment of the present invention.

FIGS. 6A through 6C are front projection views illustrating a method of treating a wafer W using the injection head 400 according to an embodiment of the present invention and FIG. 7 is a graph illustrating a result of treating a wafer W using an injection head 400 according to an embodiment of the present invention.

The wafer W is loaded above the spin head 100. The loaded wafer W is supported by the supporting pins 120 and held by the chucking pins 110.

Next, when the wafer W is rotated by the spin head 100, the cleaning solution and the gas are supplied to the injection head 400 installed below the wafer W.

The supplied gas is injected to the bottom surface of the wafer W through the gas injection opening 412 and the supplied cleaning solution flows along the first flow path 428a.

The cleaning solution flowing along the first flow path 428a is first injected through the third injection openings 426 formed on the first flow path 428a and is then injected through the first injection openings 422. The cleaning solution, which was not injected through the first and third injection opening 422 and 426 flows into the second flow path 428b and is then injected through the second injection openings 424 formed on the second flow path 428b. Meanwhile, the cleaning solution injected to the bottom surface of the wafer W moves to the edge region of the wafer W and the gas injected through the gas injection opening 412 assists movement of the cleaning solution.

After the cleaning process, the rinse solution is supplied to the rinse solution flow path 434 through the rinse solution supply line 446 and then the rinse solution removes the impurities remaining on the bottom surface of the wafer W.

As described above, the cleaning solution supplied through the cleaning solution supply line 446 is injected through the first injection openings 422 formed below the edge region of the wafer W to inject the enough cleaning solution to the edge region of the wafer W under preset injection pressure. Therefore, the cleaning process can be uniformly performed at an entire bottom surface of the wafer W.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treatment apparatus, comprising:
a rotatable spin head supporting a substrate;
an injection head installed on the spin head to supply a fluid to a bottom surface of the substrate supported on the spin head; and
a fluid supply unit supplying the fluid to the injection head;
wherein the injection head comprises:
a body disposed above a center portion of the rotatable spin head and supported on the rotatable spin head to receive the fluid from the fluid supply unit; and
an injection member extending from the body to an edge region of the substrate supported on the spin head to inject the fluid supplied from the body to the bottom surface of the substrate;
wherein the injection member comprises first injection openings and second injection openings, the first injection openings configured for injecting the fluid to the edge region of the substrate and the second injection openings configured for injecting the fluid to a middle region of the substrate, the middle region disposed between the center region and the edge region; and
first and second flow paths disposed inside the injection member, the first flow path for flowing fluid from a first end of the injection member connected to the body toward a second end of the injection member, and the second flow path extending from the first flow path for flowing fluid from the second end of the injection member toward the first end of the injection member, the second injection openings being disposed along the second flow path.

2. The substrate treatment apparatus of claim 1, wherein the substrate treatment apparatus is configured for fluid to be supplied to the first injection openings and lastly to the second injection openings.

3. The substrate treatment apparatus of claim 1, wherein the first injection openings are disposed along the first flow path.

4. The substrate treatment apparatus of claim 1, wherein the first flow path is disposed parallel to the second flow path.

5. The substrate treatment apparatus of claim 1, wherein the first and second flow paths comprise a "U" shape.

6. The substrate treatment apparatus of claim 1, wherein distances between the first injection openings are narrower than those of the second injection openings.

7. The substrate treatment apparatus of claim 1, wherein the first injection openings are slopingly formed such that each top portion of the first injection openings are directed to the edge region of the substrate.

8. The substrate treatment apparatus of claim 1, wherein the body comprises a gas injection opening injecting a gas to the center region of the substrate to help the fluid injected from the injection member to flow toward the edge region of the substrate.

9. The substrate treatment apparatus of claim 1, wherein the injection member has third injection openings injecting the fluid to the center region of the substrate.

10. The substrate treatment apparatus of claim 1, wherein the third injection openings are slopingly formed such that each top portion of the third injection openings are directed to the center region of the substrate.

11. The substrate treatment apparatus of claim 1, wherein the first and second flow paths comprise a "U" shape when viewed from above.

12. An injection head for treating a substrate, the injection head comprising:
 a body supplied with a fluid; and
 an injection member connected to the body and extending therefrom for injecting the fluid supplied from the body, the injection member comprising a proximal end connected to the body and a distal end extending from and opposing the proximal end;
 wherein the injection member comprises a first flow path and a second flow path therein, the first flow path having the fluid flowing from the proximal end of the injection member toward the distal end of the injection member, and the second flow path extending from the first flow path and having the fluid flowing from the distal end of the injection member toward the proximal end of the injection member, and a plurality of injection openings through which the fluid is injected such that at least one of the plurality injection openings on the distal end region of the injection member receives and injects the fluid before another of the plurality of injection openings on a central region of the injection member.

13. The injection head of claim 12, wherein the first flow path has first injection openings injecting the fluid at the distal end region of the injection member and the second flow path has second injection openings injecting the fluid at the central region of the injection member.

* * * * *